United States Patent
Chen et al.

(10) Patent No.: US 10,320,241 B2
(45) Date of Patent: Jun. 11, 2019

(54) WIRELESS CHARGING SYSTEM WITH OBJECT RECOGNITION

(71) Applicant: Apple Inc., Cupertino, CA (US)

(72) Inventors: Liang Chen, Auckland (NZ); Andrew Gray, Auckland (NZ); Arunim Kumar, Auckland (NZ); Zachary Strachan Harris, Auckland (NZ); Antoin J. Russell, San Francisco, CA (US); Bharat K. Patel, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/967,285

(22) Filed: Apr. 30, 2018

(65) Prior Publication Data

US 2018/0337557 A1 Nov. 22, 2018

Related U.S. Application Data

(60) Provisional application No. 62/507,684, filed on May 17, 2017.

(51) Int. Cl.
*H02J 50/40* (2016.01)
*H02J 50/12* (2016.01)
(Continued)

(52) U.S. Cl.
CPC .............. *H02J 50/12* (2016.02); *G01R 31/28* (2013.01); *G08B 1/08* (2013.01); *H02J 7/025* (2013.01);
(Continued)

(58) Field of Classification Search
CPC . H02J 5/005; H02J 7/025; H02J 17/00; B60L 11/182
See application file for complete search history.

(56) References Cited

U.S. PATENT DOCUMENTS 9,209,627 B2 12/2015 Baarman et al.
9,465,064 B2 10/2016 Roy et al.
(Continued)

FOREIGN PATENT DOCUMENTS

CN 104124768 10/2014
WO 2016076733 A1 5/2016

*Primary Examiner* — Rexford N Barnie
*Assistant Examiner* — David A Shiao
(74) *Attorney, Agent, or Firm* — Treyz Law Group, P.C.; George Victor Treyz; Jason Tsai

(57) ABSTRACT

A wireless power transmitting device transmits wireless power signals to a wireless power receiving device using output circuitry that includes an array of wireless power transmitting coils that form a wireless charging surface. During wireless power transmission operations, wireless power signals are transmitted from the array of coils to a wireless power receiving device on the charging surface. Inductance measurement circuitry such as impulse response measurement circuitry and other measurement circuitry is coupled to the output circuitry. Control circuitry in the wireless power transmitting device analyzes signals from the measurement circuitry to produce two-dimensional signal profiles across the wireless charging surface and to compare patterns in these signal profiles to predetermined signal patterns associated with the presence of known power receiving equipment on the wireless charging surface. Based on the analysis, charging parameters may be adjusted or other actions taken.

21 Claims, 9 Drawing Sheets

(51) Int. Cl.
    *G01R 31/28*     (2006.01)
    *H02J 50/60*     (2016.01)
    *H02J 7/02*     (2016.01)
    *G08B 1/08*     (2006.01)
    *H02J 50/90*     (2016.01)

(52) U.S. Cl.
    CPC .............. *H02J 50/40* (2016.02); *H02J 50/60* (2016.02); *H02J 50/90* (2016.02)

(56) References Cited

U.S. PATENT DOCUMENTS

| | | |
|---|---|---|
| 9,726,518 B2 | 8/2017 | Widmer et al. |
| 2009/0281731 A1* | 11/2009 | Morrison .................. G01V 3/28 702/7 |
| 2012/0007437 A1* | 1/2012 | Fells ........................ H01F 38/14 307/104 |
| 2013/0127254 A1* | 5/2013 | Miichi .................... H01F 38/14 307/104 |
| 2014/0015522 A1* | 1/2014 | Widmer ................ G01D 5/2006 324/239 |
| 2014/0183964 A1* | 7/2014 | Walley .................. H04B 5/0075 307/104 |
| 2015/0054355 A1* | 2/2015 | Ben-Shalom ........ H04B 5/0037 307/104 |
| 2015/0109000 A1* | 4/2015 | Sieber .................... G01B 7/003 324/655 |
| 2015/0321567 A1 | 11/2015 | Czainski et al. |
| 2015/0323694 A1* | 11/2015 | Roy ........................ H02J 17/00 307/104 |
| 2016/0013658 A1 | 1/2016 | Kohara et al. |
| 2016/0028248 A1 | 1/2016 | Asanuma et al. |
| 2017/0237296 A1 | 8/2017 | Keith et al. |
| 2017/0248726 A1* | 8/2017 | Adachi .................... H01F 5/00 |

\* cited by examiner

WIRELESS CHARGING SYSTEM WITH OBJECT RECOGNITION

This patent application claims the benefit of provisional patent application No. 62/507,684, filed on May 17, 2017 which is hereby incorporated by reference herein in its entirety.

FIELD

This relates generally to wireless systems, and, more particularly, to systems in which devices are wirelessly charged.

BACKGROUND

In a wireless charging system, a wireless power transmitting device such as a device with a charging surface wirelessly transmits power to a portable electronic device. The portable electronic device receives the wirelessly transmitted power and uses this power to charge an internal battery or to power the device.

SUMMARY

A wireless power system includes a wireless power transmitting device and a wireless power receiving device. The wireless transmitting device transmits wireless power signals to the wireless power receiving device using output circuitry that includes an array of wireless power transmitting coils that form a wireless charging surface. The wireless charging surface is configured to receive the wireless power receiving device.

During wireless power transmission operations, wireless power signals are transmitted from the array of coils to the wireless power receiving device. Inductance measurement circuitry such as impulse response measurement circuitry and other measurement circuitry is coupled to the output circuitry. The measurement circuitry includes an adjustable-frequency oscillator so that signal measurements may be made to the coils in the output circuitry at one or more frequencies of interest.

Control circuitry in the wireless power transmitting device analyzes signals from the measurement circuitry to produce two-dimensional signal profiles of inductance and other signal measurements across the wireless charging surface and to compare patterns in these signal profiles to predetermined signal patterns associated with the presence of known power receiving equipment on the wireless charging surface. Based on the analysis, charging parameters may be adjusted or other actions taken. For example, the control circuitry can determine whether wireless power transmission operations should be performed, can determine whether a foreign object such as a coin or a sensitive radio-frequency identification device is present indicating that wireless power transmission operations should not be performed, can determine whether an alert should be issued to a user to inform the user that a device on the charging surface should be reoriented (e.g., flipped) prior to wireless power transmission operations, may perform additional signal measurements at one or more frequencies, may initiate wireless communications with the wireless power receiving device, or may take other suitable actions.

DETAILED DESCRIPTION

A wireless power system has a wireless power transmitting device that transmits power wirelessly to a wireless power receiving device. The wireless power transmitting device is a device such as a wireless charging mat, wireless charging puck, wireless charging stand, wireless charging table, or other wireless power transmitting equipment. The wireless power transmitting device has one or more coils that are used in transmitting wireless power to one or more wireless power receiving coils in the wireless power receiving device. The wireless power receiving device is a device such as a cellular telephone, watch, media player, tablet computer, pair of earbuds, remote control, laptop computer, other portable electronic device, or other wireless power receiving equipment.

During operation, the wireless power transmitting device supplies alternating-current signals to one or more wireless power transmitting coils. This causes the coils to transmit alternating-current electromagnetic signals (sometimes referred to as wireless power signals) to one or more corresponding coils in the wireless power receiving device. Rectifier circuitry in the wireless power receiving device converts received wireless power signals into direct-current (DC) power for powering the wireless power receiving device.

Figure 1:
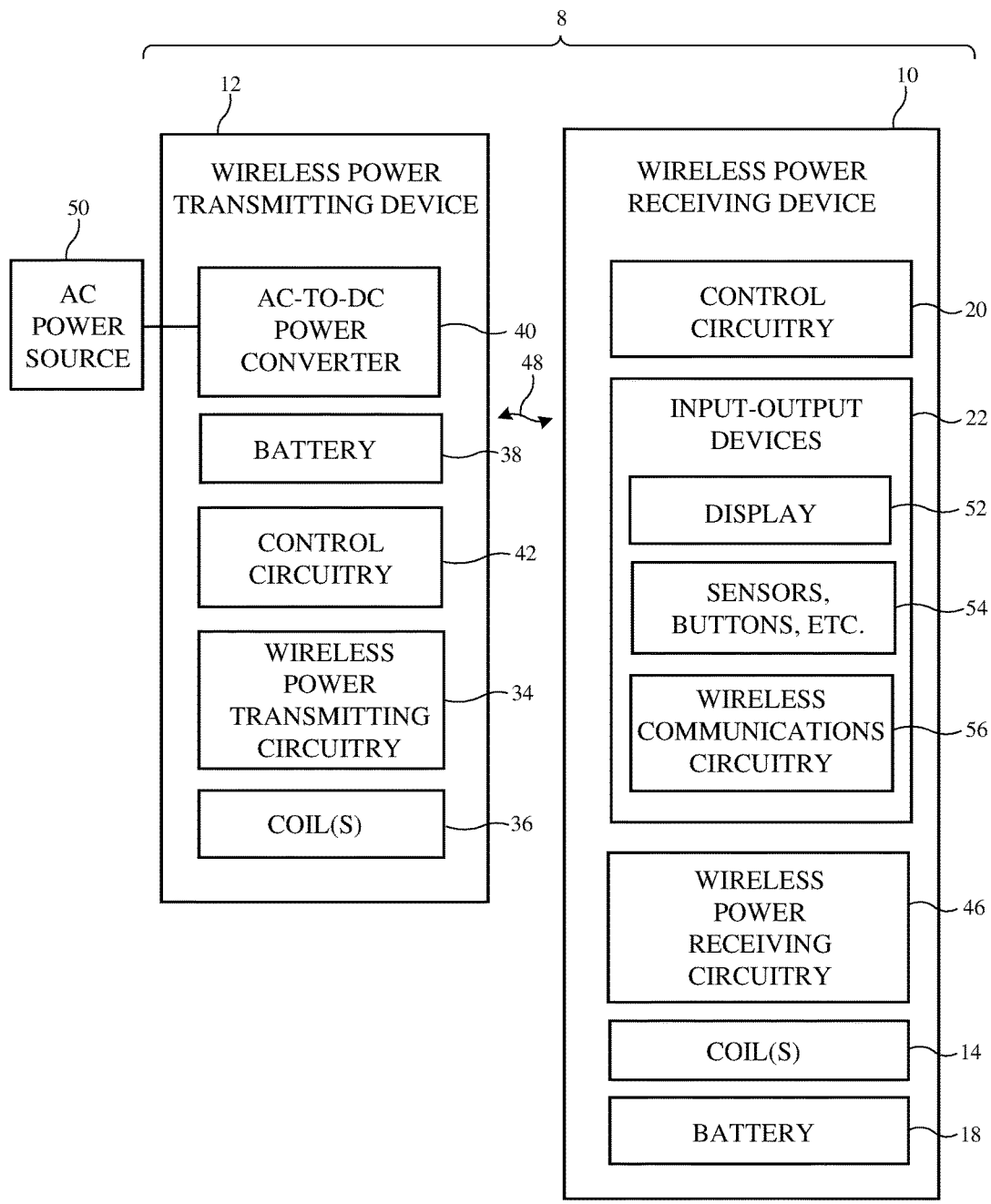
FIG. 1 is a schematic diagram of an illustrative wireless charging system in accordance with some embodiments.

An illustrative wireless power system (wireless charging system) is shown in FIG. 1. As shown in FIG. 1, wireless power system 8 includes wireless power transmitting device 12 and one or more wireless power receiving devices such as wireless power receiving device 10. Device 12 may be a stand-alone device such as a wireless charging mat, may be built into furniture, or may be other wireless charging equipment. Device 10 is a portable electronic device such as a wristwatch, a cellular telephone, a tablet computer, or other electronic equipment. Illustrative configurations in which device 12 is a mat or other equipment that forms a wireless charging surface and in which device 10 is a portable electronic device that rests on the wireless charging surface during wireless power transfer operations may sometimes be described herein as an example.

During operation of system 8, a user places one or more devices 10 on the charging surface of device 12. Power transmitting device 12 is coupled to a source of alternating-current voltage such as alternating-current power source 50 (e.g., a wall outlet that supplies line power or other source of mains electricity), has a battery such as battery 38 for supplying power, and/or is coupled to another source of power. A power converter such as AC-DC power converter 40 can convert power from a mains power source or other AC power source into DC power that is used to power control circuitry 42 and other circuitry in device 12. During operation, control circuitry 42 uses wireless power transmitting circuitry 34 and one or more coils 36 coupled to circuitry 34 to transmit alternating-current electromagnetic signals 48 to device 10 and thereby convey wireless power to wireless power receiving circuitry 46 of device 10.

Power transmitting circuitry 34 has switching circuitry (e.g., transistors in an inverter circuit) that are turned on and off based on control signals provided by control circuitry 42 to create AC current signals through appropriate coils 36. As the AC currents pass through a coil 36 that is being driven by the inverter circuit, alternating-current electromagnetic fields (wireless power signals 48) are produced that are received by one or more corresponding coils 14 coupled to wireless power receiving circuitry 46 in receiving device 10. When the alternating-current electromagnetic fields are received by coil 14, corresponding alternating-current currents and voltages are induced in coil 14. Rectifier circuitry in circuitry 46 converts received AC signals (received alternating-current currents and voltages associated with wireless power signals) from one or more coils 14 into DC voltage signals for powering device 10. The DC voltages are used in powering components in device 10 such as display 52, touch sensor components and other sensors 54 (e.g., accelerometers, force sensors, temperature sensors, light sensors, pressure sensors, gas sensors, moisture sensors, magnetic sensors, etc.), wireless communications circuits 56 for communicating wirelessly with control circuitry 42 of device 12 and/or other equipment, audio components, and other components (e.g., input-output devices 22 and/or control circuitry 20) and are used in charging an internal battery in device 10 such as battery 18.

Devices 12 and 10 include control circuitry 42 and 20. Control circuitry 42 and 20 includes storage and processing circuitry such as microprocessors, power management units, baseband processors, digital signal processors, microcontrollers, and/or application-specific integrated circuits with processing circuits. Control circuitry 42 and 20 is configured to execute instructions for implementing desired control and communications features in system 8. For example, control circuitry 42 and/or 20 may be used in determining power transmission levels, processing sensor data, processing user input, processing other information such as information on wireless coupling efficiency from transmitting circuitry 34, processing information from receiving circuitry 46, using information from circuitry 34 and/or 46 such as signal measurements on output circuitry in circuitry 34 and other information from circuitry 34 and/or 46 to determine when to start and stop wireless charging operations, adjusting charging parameters such as charging frequencies, coil assignments in a multi-coil array, and wireless power transmission levels, and performing other control functions. Control circuitry 42 and/or 20 may be configured to perform these operations using hardware (e.g., dedicated hardware or circuitry) and/or software (e.g., code that runs on the hardware of system 8). Software code for performing these operations is stored on non-transitory computer readable storage media (e.g., tangible computer readable storage media). The software code may sometimes be referred to as software, data, program instructions, instructions, or code. The non-transitory computer readable storage media may include non-volatile memory such as non-volatile random-access memory (NVRAM), one or more hard drives (e.g., magnetic drives or solid state drives), one or more removable flash drives or other removable media, other computer readable media, or combinations of these computer readable media or other storage. Software stored on the non-transitory computer readable storage media may be executed on the processing circuitry of control circuitry 42 and/or 20. The processing circuitry may include application-specific integrated circuits with processing circuitry, one or more microprocessors, or other processing circuitry.

Device 12 and/or device 10 may communicate wirelessly. Devices 10 and 12 may, for example, have wireless transceiver circuitry in control circuitry 42 and 20 (and/or wireless communications circuitry such as circuitry 56 of FIG. 1) that allows wireless transmission of signals between devices 10 and 12 (e.g., using antennas that are separate from coils 36 and 14 to transmit and receive unidirectional or bidirectional wireless signals, using coils 36 and 14 to transmit and receive unidirectional or bidirectional wireless signals, etc.).

Figure 2:
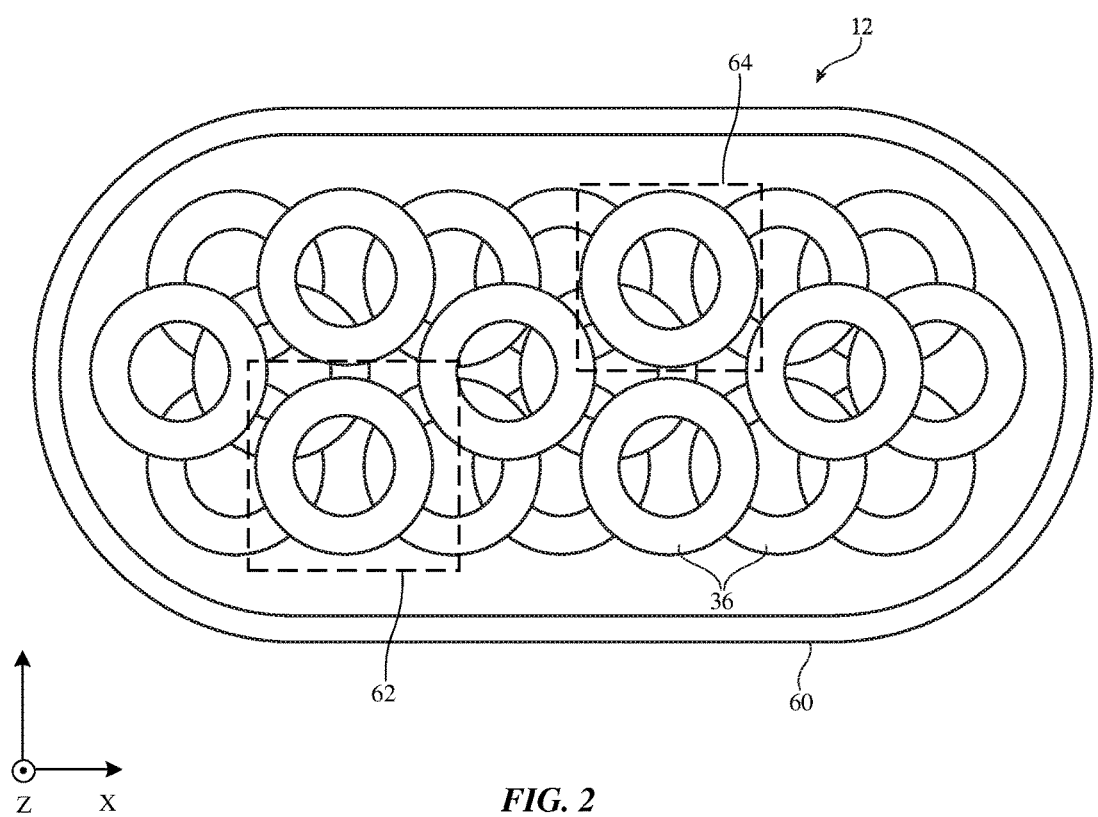
FIG. 2 is a top view of an illustrative wireless power transmitting device with an array of coils that forms a wireless charging surface in accordance with an embodiment.

With one illustrative configuration, wireless transmitting device 12 is a wireless charging mat or other wireless power transmitting equipment that has an array of coils 36 that supply wireless power over a wireless charging surface. This type of arrangement is shown in FIG. 2. In the example of FIG. 2, device 12 has an array of coils 36 that lie in the X-Y plane. Coils 36 of device 12 are covered by a planar dielectric structure such as a plastic member or other structure forming charging surface 60. The lateral dimensions (X and Y dimensions) of the array of coils 36 in device 36 may be 1-1000 cm, 5-50 cm, less than 5 cm, more than 5 cm, more than 20 cm, less than 200 cm, less than 75 cm, or other suitable size. Coils 36 may overlap or may be arranged in a non-overlapping configuration. Coils 36 can be placed in a rectangular array having rows and columns and/or may be tiled using a hexagonal tile pattern or other pattern. There may be N×M coils 36 in the coil array, where N and M may be 1-100, 1-10, 2-4, 2-8, 3-7, 4-6, 5-20, less than 40, less than 30, less than 20, less than 10, at least 2, at least 3, at least 4, at least 5, at least 6, at least 10, at least 15, or other suitable value. The values of N and M may be the same or may be different.

During operation, a user places one or more devices 10 on charging surface 60. Foreign objects such as coils, paper clips, scraps of metal foil, and/or other foreign conductive objects may be accidentally placed on surface 60. System 8 automatically detects whether conductive objects located on surface 60 correspond to devices 10 or incompatible foreign objects and/or performs other analysis on the object or objects on surface 60 and takes suitable action. With one illustrative arrangement, system 8 checks whether objects located on surface 60 include sensitive items such as radio-frequency identification (RFID) devices or other potentially sensitive electronic equipment that could be potentially damaged upon exposure to large fields from coils 36 before system 8 allows wireless power to be transmitted to those objects. System 8 may also determine whether an electronic device is oriented satisfactorily for charging and may issue alerts to a user or take other suitable action (e.g., system 8 may proceed with wireless charging if no foreign objects are present and if device 10 is oriented satisfactorily for wireless power transfer operations, system 8 may select appropriate coils 36 to use in wireless power transfer operations, device 12 may adjust wireless power transfer settings such as wireless power signal frequency, a maximum power setting, etc., device 12 may initiate and conduct wireless communications operations that request that device 10 provide device 12 with authentication information, device type information, preferred wireless charging settings information, and/or other information).

As shown in the example of FIG. 2, external objects such as external object 62 and object 64 may overlap one or more coils 36. In some situations, objects 62 and 64 will be portable electronic devices 10. In other situations, one or more of objects 62 and 64 will be incompatible external objects (e.g., conductive foreign objects such as metallic coins, sensitive devices such as RFID devices, etc.). Situations may also arise in which incompatible external objects and portable electronic devices overlap the same coil or coils 36.

Figure 3:
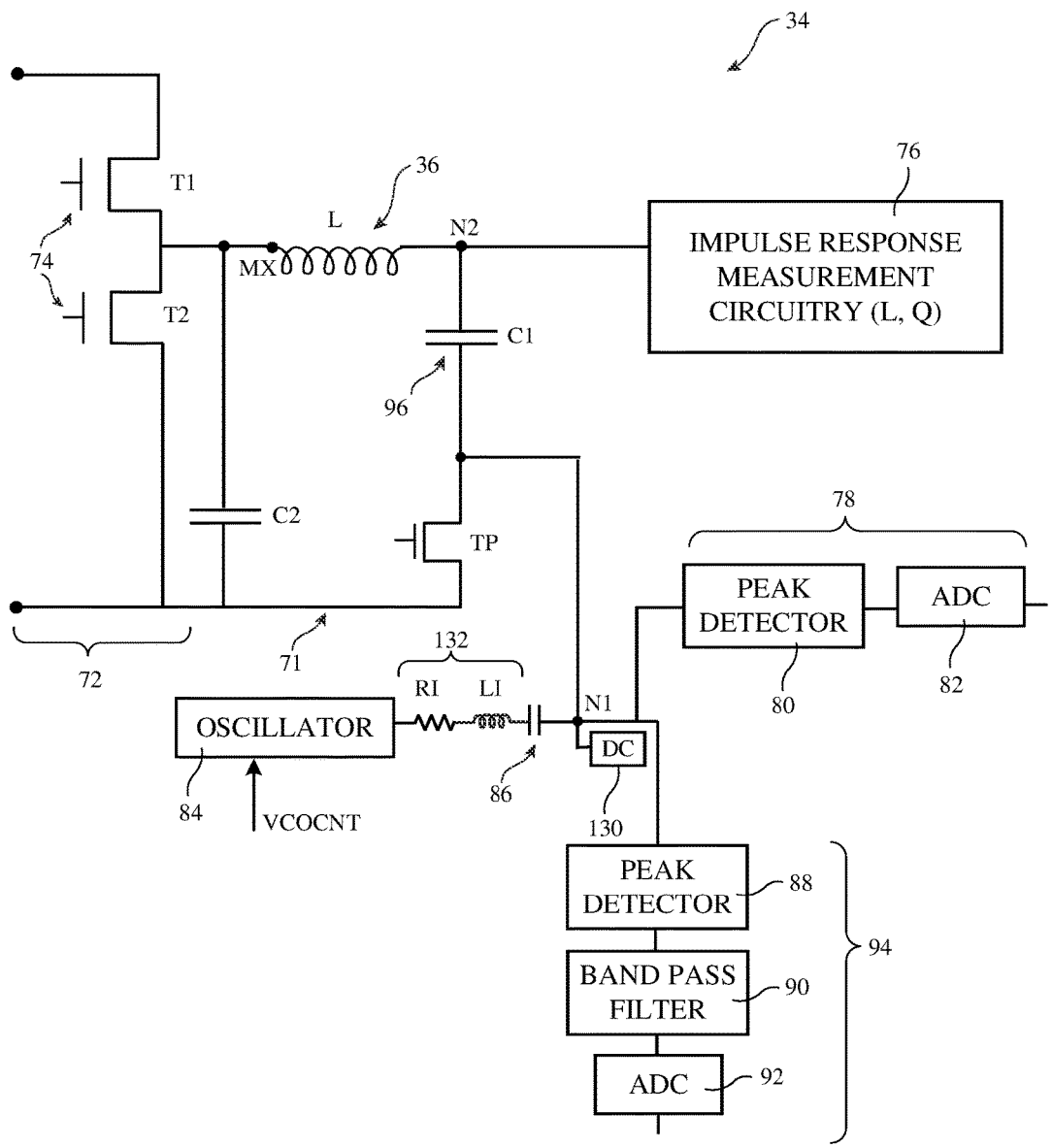
FIG. 3 is a circuit diagram of illustrative wireless power transmitting circuitry with output circuit signal measurement circuitry in a wireless power transmitting device in accordance with an embodiment.

Illustrative wireless power transmitting circuitry 34 that includes circuitry to detect and characterize external objects on surface 60 is shown in FIG. 3. As shown in FIG. 2, circuitry 34 may include an inverter such as inverter 72 or other drive circuit that produces wireless power signals that are transmitted through an output circuit that includes one or more coils 36. A single coil 36 is shown in the example of FIG. 2. In general, device 12 may have any suitable number of coils 36 (1-100, more than 5, more than 10, fewer than 40, fewer than 30, 5-25, etc.). Switching circuitry MX (sometimes referred to as multiplexer circuitry) that is controlled by control circuitry 42 can be located before and/or after each coil 36 and/or before and/or after the other components of output circuit 71 and can be used to switch desired sets of one or more coils 36 (desired output circuits 71) into or out of use.

For example, if it is determined that object 62 of FIG. 2 is a wireless power receiving device 10 and object 64 is an incompatible foreign object such as a coin, the coils overlapping object 62 may be activated during wireless power transmission operations and the coils under object 64 may be deactivated so that these coils do not transmit wireless power. Other coils 36 (e.g., coils not overlapped by object 64 in this example) can also be turned off during wireless power transmission operations, if desired. Output circuitry such as output circuit 71 of FIG. 3 (e.g., capacitor 96) may be shared among multiple coils 36 using multiplexer circuitry MX and/or there may be multiple respective output circuits 71 each with components such as capacitor 96 and each coupled by multiplexer MX to a respective coil 36. Control circuitry 42 can control multiplexer MX to select one or more coils 36 in the coil array for wireless power transmission operations.

With continued reference to FIG. 3, during wireless power transmission operations, transistors 74 of inverter 72 are driven by time-varying control signals from control circuitry 42. Control circuitry 42 may also use transistors 74 of inverter 72 to apply square wave pulses or other impulses to coil 36 (e.g., during impulse response measurements). If desired, a capacitor such as capacitor C2 may be placed at the output of inverter 72 to smooth the square wave pulses. The value of C2 may be, for example, 4.7 nF, more than 2 nF, less than 6 nF or other suitable smoothing capacitance value.

Coil 36 (e.g., a coil that has been selected using multiplexing circuitry MX) has an inductance L. Capacitor 96 has a capacitance C1 that is coupled in series with inductance L in output circuit 90. When supplied with alternating-current drive signals from inverter 72 while switch (transistor) TP is closed, the output circuit formed from coil 36 and capacitor 96 produces alternating-current electromagnetic fields that are received by one or more coils 14 in device 10. The inductance L of each coil 36 is influenced by magnetic coupling with external objects, so measurements of inductance L for one or more of coils 36 in device 12 at various frequencies can reveal information on objects on charging surface 60.

To conserve power, device 12 may be operated in a standby mode while awaiting use to supply wireless power to devices 10. The signal measurement circuitry of FIG. 3 (sometimes referred to as output circuit signal measurement circuitry, external or foreign object detection circuitry, etc.) monitors for the presence of external objects during standby. The power consumption of the measurement circuitry in transmitter circuitry 34 during standby operations may be less than 50 mW, less than 200 mW, more than 1 mW, or other suitable value.

In standby mode, device 12 periodically scans coils 36 (e.g., device 12 scans each of coils 36) for the presence of external objects (e.g., devices 10, foreign objects such as coins, etc.). To probe a selected coil for changes in inductance L due to external objects, a probe signal is driven onto node N1 with oscillator circuitry 84 while control circuitry 42 turns off inverter 72 (e.g., transistors 74 are not used to drive signals onto node N2). Control circuitry 42 uses, for example, oscillator circuitry 84 (e.g., one or more voltage controlled oscillators, one or more other adjustable oscillators, and/or other oscillatory circuitry) to produce an alternating-current probe signal (e.g., a sine wave, square wave, etc.) at a probe frequency fr (e.g., 4 MHz or other suitable frequency such as a frequency of at least 500 kHz, at least 1 MHz, at least 2 MHz, less than 10 MHz, between 1 MHz and 10 MHz, or other suitable frequency). The probe frequency (oscillator output frequency) fr that is used during standby mode is a frequency that differs from RFID frequencies such as 13.56 MHz and that differs from the normal alternating-current frequency supplied to output circuit 71 by inverter 72 during wireless charging operations, which may be, for example, 100-500 kHz, more than 50 kHz, more than 100 kHz, more than 200 kHz, less than 450 kHz, less than 400 kHz, less than 300 kHz, or other suitable wireless power alternating-current drive frequency.

The signal at frequency fr is applied to node N1 from oscillator circuitry 84 via impedance injection network 132 and capacitor 86 and is coupled to coil 36 via capacitor 96 while inverter 72 is held in an off state by control circuitry 42. Impedance injection network 132 includes resistor RI and inductor LI and has an impedance that helps oscillator 84 effectively inject alternating-current signals (e.g., probe signals at one or more frequencies or a swept frequency signal) onto node N1 for detection by the measurement circuitry of FIG. 3. Control circuitry 42 controls multiplexer(s) MX to select the coil to which the signal at frequency fr is applied (e.g., coil 36 of FIG. 3) from the array of coils 36 of device 12 shown in FIG. 2. Capacitance C1 may have a value of 150 µF, more than 10 µF, less than 1000 µF, or other suitable value. Transistor TP may have a parasitic capacitance Cp (e.g., a parasitic capacitance of 85 pF, more than 10 pF, less than 800 pF, or other suitable value) when open.

With one illustrative configuration, direct-current voltage source 130 applies a 20 V direct-current bias voltage to node N1 when transistor TP is open, which reduces the parasitic capacitance of transistor TP from about 150 pF to about 85 pF (as an example). For standby operations, control circuitry 42 opens transistor TP so that so that oscillator output signals from oscillator 84 are routed through coil 36. When transistor TP is open, the presence of low parasitic capacitance Cp helps reduce the capacitance in parallel with coil 36 and reduces the potential negative impact of the potentially large parasitic capacitances of transistors T1 and T2 (e.g., 150 pF or more) and smoothing capacitor C2 (e.g., 4.7 nF, more than 2 nF, less than 6 nF or other suitable smoothing capacitance value) on the detection sensitivity of measurement circuits 78 and 94 (e.g., signal attenuation on node N1 will be avoided). This allows transistors T1 and T2 to be optimized for use in inverter 74 (e.g., the parasitic capacitances of field-effect transistors T1 and T2 can be large when lowering drain-source "on resistance" Rds-on to optimize field-effect transistors T1 and T2 for power transfer applications) and allows smoothing capacitor C2 to be used at the output of inverter 74.

With TP open, output circuit 71 (coil 36 in series with C1 and Cp) will be characterized by a resonance at frequency fres of equation 1.

$$fres = 1/(2\pi(LCp)^{1/2}) \quad (1)$$

Figure 4:
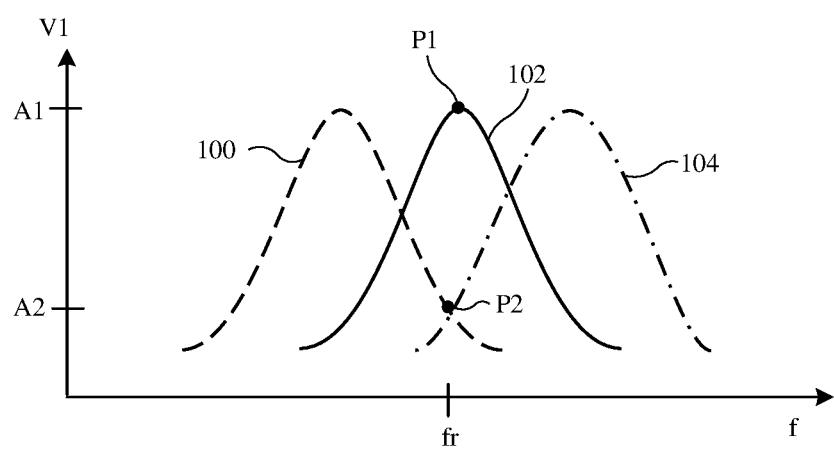
FIG. 4 is a graph showing the response of various illustrative objects on the surface of a wireless power transmitting device in accordance with an embodiment.

The expected measured signal at node N1 (output voltage V1) as a function of applied signal frequency f in the absence of external objects on coil 36 is given by curve 102 of FIG. 4. In the presence of an electronic device such as device 10 that contains one or more coils 14 overlapping coil 36, curve 102 may shift to lower frequencies as shown by curve 100. In the presence of a coin or other incompatible foreign object overlapping coil 36, curve 102 may shift to higher frequencies as shown by curve 104. Changes in load can be detected by monitoring the value of V1 using measurement circuit 78 of FIG. 3 at one or more probe frequencies. For example, oscillator circuitry 84 may be used to apply a probe signal to node N1 at a frequency fr that has been chosen to match resonant frequency fres of equation 1. If desired, multiple probe signals may be applied to output circuit 72 while using measurement circuitry to evaluate the resulting signal on node N1. For example, the direction of change in curve 102 (shifting higher or lower) can be detected by taking multiple measurements of V1 at two or more frequencies near frequency fr of FIG. 4). In general, measurements can be taken at a single frequency fr, at two frequencies, at a series of frequencies ranging from a low frequency to a high frequency, at frequencies in multiple respective ranges of frequencies, in a set of three or more different frequencies, or other suitable frequencies.

To make measurements of V1, measurement circuit 78 includes peak detector 80 and analog-to-digital converter 82. Circuit 78 measures the signal at node N1 and supplies a corresponding digital version of this signal to control circuitry 42. In the presence of an object overlapping coil 36 (whether from device 10, a sensitive RFID device, or a coin or other incompatible foreign object), signal V1 will drop. For example, the signal on node N1 may drop from a value of P1 (e.g., a peak value associated with curve 102) when coil 36 is unloaded to a reduced value of P2 when coil 36 is loaded due to the presence of an external object (e.g., a reduced value P2 associated with shifted curve 100 from an overlapping wireless power receiving device with a coil or a reduced value P2 associated with shifted curve 102 from an overlapping coin).

During standby operations when determining whether to transition device 12 to full power operation and/or at other suitable times when it is desired to make signal measurements, control circuitry 42 can scan through coils 36 by using multiplexer circuitry MX or other switching circuitry in circuitry 34. In some embodiments, this sequentially couples each of coils 36 to node N1 while circuitry 78 measures signal V1 for each selected coil 36. If no changes in signal V1 are detected, control circuitry 42 can conclude that no objects are present on device 12 (e.g., no objects are resting on charging surface 60). If a change in V1 is detected, control circuitry 42 performs additional operations to confirm that device 10 is present rather than an incompatible foreign object such as a coin. As an example, measurements with circuitry 78 can be made at one or more frequencies, wireless communications with device 10 may be initiated to determine whether device 10 is authorized to receive wireless power signals, and/or additional measurements can be made.

With one illustrative approach, control circuitry 42 uses impulse response measurement circuitry 76 (sometimes referred to as inductance measurement circuitry and/or Q factor measurement circuitry) to perform low-frequency measurements of inductance L and quality factor Q in response to detection of a load on one or more coils 36 during standby. During impulse response measurements, control circuitry 42 directs inverter 72 to supply one or more excitation pulses (impulses) to coil 36 while turning on transistor TP, so that L and C1 in output circuit 71 form a resonant circuit (e.g., a circuit where resonant current passes through T2, which can be turned on). The impulses may be, for example, square wave pulses of 1 μs in duration. Longer or shorter pulses may be applied, if desired. The resonant circuit may resonate at a frequency near to the normal wireless charging frequency of coil 36 (e.g., about 320 kHz, 100-500 kHz, more than 50 kHz, more than 100 kHz, more than 200 kHz, less than 450 kHz, less than 400 kHz, less than 300 kHz, or other suitable wireless charging frequency).

Figure 5:
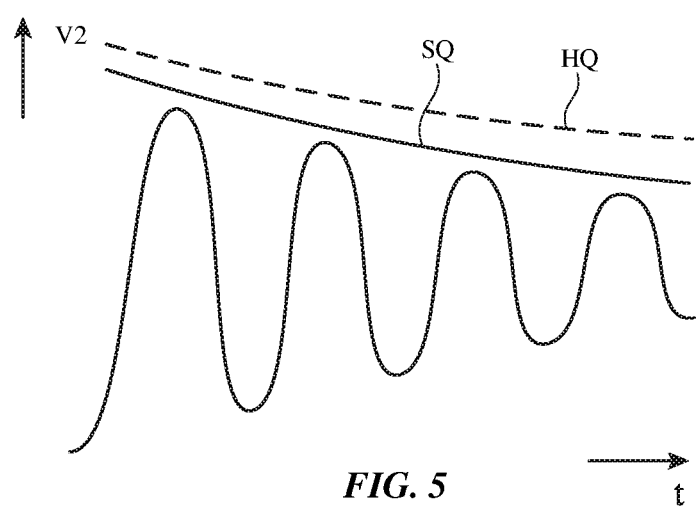
FIG. 5 is a graph of an illustrative impulse response of the type that may be used to characterize objects on a wireless power transmitting device in accordance with an embodiment.

The impulse response (voltage signal V2 on node N1) of circuit 71 to the applied pulse(s) is as shown in FIG. 5. The frequency of the impulse response signal of FIG. 5 is proportional to 1/sqrt(LC), so L can be obtained from the known value of C1 and the measured frequency of the impulse response signal. Q may be derived from L and the measured decay of the impulse response signal. As shown in FIG. 5, if signal V2 decays slowly, Q is high (e.g., HQ) and if signal V2 decays more rapidly, Q is low (e.g., SQ). Measurement of the decay envelope of V2 and frequency of V2 of the impulse response signal of FIG. 5 with circuitry 76 will therefore allow control circuitry 42 to determine Q and L.

In some configurations, if the measured value of L for a given coil matches the normal L value expected for each of coils 36 in the array of coils 36 overlapping surface 60 (e.g., when the measured L value is not influenced by the presence device 10 or other external object on surface 60), control circuitry 42 can conclude that no external object suitable for wireless charging is present. If a given measured value of L is larger than that expected for an unloaded coil, control circuitry 42 can conclude that an external object is present that appears to be in an appropriate condition for wireless charging and can perform additional measurement operations. For example, control circuitry 42 can perform a swept-frequency measurement (sometimes referred to as an RFID checking measurement) on node N1 to check whether a sensitive device such as an RFID device is present on surface 60. In other configurations, two-dimensional measurements of L are gathered using the coil array formed by coils 36 and a resulting two-dimensional inductance profile is used in taking suitable action. For example, the two-dimensional profile may contain patterns that can be recognized upon comparison to predetermined patterns that are stored in device 12 during manufacturing (e.g., based on characterization of device 12 in the presence of known wireless power receiving devices 10). Actions may be taken when a match between a pattern in a two-dimensional inductance profile and predetermined inductance patters (e.g., actions may be taken such as adjusting charging parameters, issuing alerts to a user, etc.). Two-dimensional profiles of measurements taken at frequency fr and/or additional frequencies (e.g., measurements taken using oscillator 84 and measurement circuitry coupled to node N1 in output circuitry 71) can be gathered using coils 36 and this information used in addition to or instead of the two-dimensional inductance profile in determining suitable actions to take in system 8.

The measurements made by circuitry 76 are performed on one or more of coils 36 (e.g., these measurements may be performed on each of coils 36 in the array of coils in device 12). Circuitry 42 uses these impulse response measurements to identify spatial patterns in measured L values (and/or Q factor values) across surface 60. Analysis of a pattern of measured inductance (L) change can help determine whether a known type of device 10 is present on coils 36. Analysis of the spatial patterns of measured inductance L (and, if desired, Q factor, which has an inverse relationship with respect to L, and/or other patterns in the two-dimensional signal profiles gathered as a function of coil position in the X-Y plane of surface 60 using measurement circuitry coupled to node N1) may be used in determining when to transit wireless power from device 12 to device 10 and/or in taking other suitable actions. If, for example, the value of L for each of coils 36 is unchanged from its nominal state, circuitry 42 can conclude that no external device suitable for wireless charging is present. If the value of L for a given one of coils 36 is elevated and this elevated coil inductance pattern matches a known pattern produced by a receiving device on charging surface 60 or other suitable pattern of measured L values is detected, circuitry 42 can conclude that an external device that is suitable for wireless charging is present on that coil and can prepare to transmit wireless power using that coil.

Before transmitting wireless power, it may be desirable to check whether a sensitive device such as an RFID device is present on surface 60. Sensitive devices can potentially be harmed by excessive wireless power levels, so checking for sensitive devices helps avoid damage to sensitive devices during subsequent wireless power transfer operations. In some scenarios, both portable device 10 and a sensitive device may be present over the same coil 36 in the array of coils 36 in device 12. A sensitive device may, as an example, be present under a cellular telephone, watch, or other portable device 10 that includes a wireless power receiving coil 14. Even though the presence of the portable device 10 can be detected by making inductance measurements with coils 36, it is desirable to check whether a sensitive device is also present so as to avoid damaging the sensitive device by exposure to wireless power transmissions.

Radio-frequency identification (RFID) devices typically have RFID coil circuits that resonate at relatively high frequencies such as a frequency of 13.56 MHz. In some embodiments, to determine if an RFID is present on surface 60, RFID checking measurements are performed by measuring a voltage signal V3 on node N1 using measurement circuit 94 (FIG. 3). During these checking measurements, control circuitry 42 directs oscillator circuitry 84 to sweep the frequency of the signal supplied to node N1 between a first frequency f1 and a second frequency f2 covering the expected resonant frequencies of popular RFID coils. Transistor TP may remain open so that current from oscillator circuitry 84 flows through each coil 36 that has been selected during measurement operations. The value of f1 may be, for example, 10 MHz, more than 5 MHz, less than 11 MHz, less than 12 MHz, less than 15 MHz, or other suitable value. The value of f2 may be 30 MHz, more than 14 MHz, more than 15 MHz, more than 20 MHz, less than 45 MHz, or other suitable value.

As shown in FIG. 3, swept-frequency measurement circuit 94 includes a peak detector such as peak detector 88 that measures the voltage on node N1, band pass filter 90, and analog-to-digital converter circuitry 92. Analog-to-digital converter circuitry 92 supplies a digital version of its input to control circuitry 42.

Figure 6:
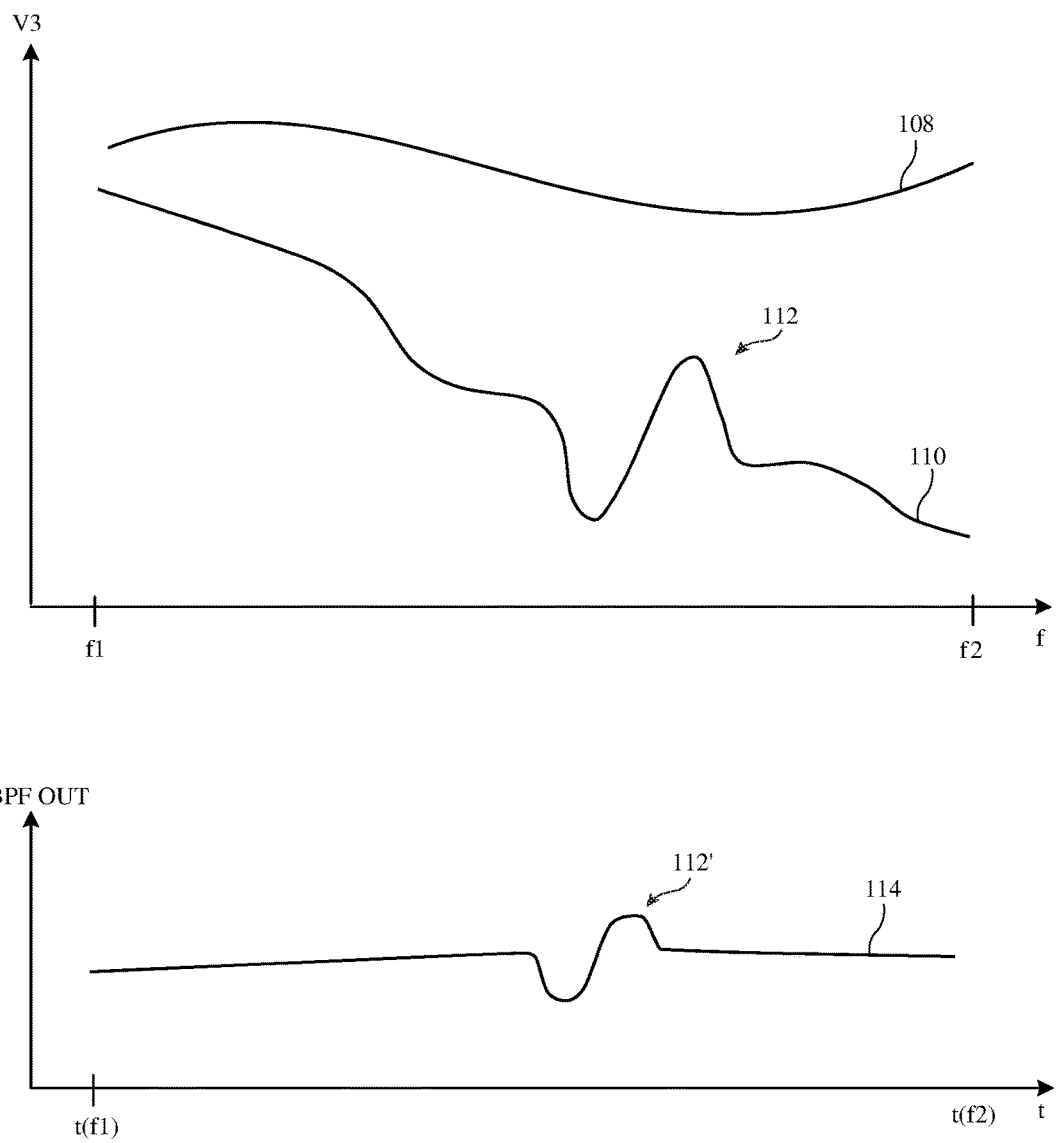
FIG. 6 is a graph showing output signal traces of the type that may be associated with placing a sensitive object such as a radio-frequency identification device on the surface of a wireless power transmitting device in accordance with an embodiment.

When no RFID device is present on charging surface 60 of device 12, peak detector 88 will detect a signal such as the signal of curve 108 in FIG. 6. When an RFID device overlaps charging surface 60, signal V3 (see, e.g., curve 110) will exhibit a resonance signal such as signal 112 in as frequency f is swept between f1 and f2. Resonance signal 112 may, for example, correspond to a resonance frequency such as an RFID resonant frequency of 13.56 MHz.

Frequency f is swept between f1 and f2 at a predetermined speed. For example, control circuitry 42 may sweep frequency from f1 to f2 in an interval of 2 ms, at least 1 ms, less than 3 ms, or other suitable time period. The pass frequency of band pass filter 90 is selected so that resonance signal 112 will pass through band pass filter 90 as band pass filtered signal 112' of band pass output curve 114 when frequency f is changed between f1 and f2 at the predetermined speed (e.g., when the full sweep range is covered in an interval of 2 ms, etc.). The use of band pass filter 90 helps remove non-resonant signal fluctuations from curve 110 (e.g., signal tilt and slowly varying increases and/or decreases of the type shown by illustrative curve 110 of FIG. 6). The resulting band-pass-filtered signal (curve 114 and filtered signal resonance 112') can be processed by control circuitry 42 to confirm that an RFID resonance at a particular frequency has been detected. Control circuitry 42 can then take appropriate action. As an example, if no RFID signature is detected, control circuitry 42 can conclude that the detected external object on surface 60 is likely a portable device (device 10 with coil 14) without any intervening (overlapping) sensitive RFID device. If an RFID signature (e.g., resonant signal 112' at an RFID frequency such as 13.56 MHz) is detected, control circuitry 42 can reduce the level of wireless power transmitted by coils 36 or can prevent wireless power from being transmitted by coils 36 (or at least the coils that are overlapped by the sensitive RFID device) so as to mitigate damage to the RFID device. Optionally, control circuit 42 can issue an alert to a user and/or take other suitable actions.

In some embodiments, signal processing operations may be performed on one or more two-dimensional signal measurement profiles taken with impulse response measurement circuitry 76, circuit 78, and/or circuit 94 to help determine which actions to take in devices 12 and/or 10. For example, signal profiles can be analyzed by comparing signal profiles to known patterns of valid electronic devices on charging surface 60 to determine whether device 10 is right side up or upside down (and therefore whether an alert indicating this orientation information should be issued), to determine which coil or coils should be used in transmitting wireless power to device 10, to determine what wireless power transfer settings should be used, to determine whether device 10 is covering a foreign object that is incompatible with device 10 or whether an incompatible object is otherwise present on surface 60, to determine whether wireless charging should proceed or should be halted, etc.

Figure 7:
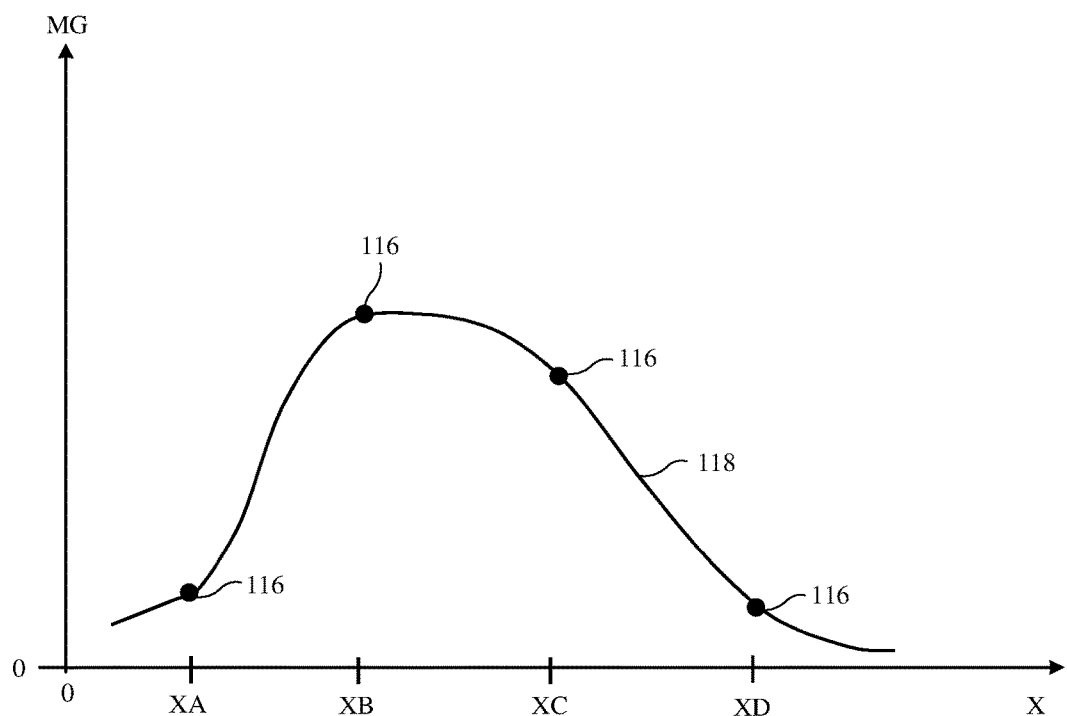
FIG. 7 is a graph of illustrative signal measurements taken by output circuit signal measurement circuitry across multiple coils in output circuitry an illustrative wireless power transmitting device in accordance with an embodiment.

When taking signal measurements, two-dimensional profiles may be formed from a series of discrete measurements (e.g., measurements made with respective coils 36) and/or curves may be fit to a series of discrete measurements to form two-dimensional profiles of measured signals. Consider, as an example, measurement of a signal MG of FIG. 7 as a function of coil position in dimension X. As shown in FIG. 7, a finite number of coils 36 (e.g., four coils) at respective coil locations XA, XB, XC, and XD may make four corresponding signal measurements 116 (e.g., measurements of inductance L made with circuitry 76, signal measurements at node N1 made with circuit 78 or circuit 84, etc.). The measurements (signal MG) can be plotted in dimensions X and Y to form a two-dimensional profile of MG across surface 60 and/or curves can be fit to the plotted measurements to produce a two-dimensional signal profile for signal MG, as illustrated by curve 118, which has been fit to points 116.

Curve fitting operations may use polynomial expressions for the two-dimensional profile being fit and may use a fit metric such as a least-squares fit or other metric that characterizes how well a given two-dimensional profile matches signal measurements 116. Each measurement 116 corresponds to a measurement with a different respective coil 36 in the array of coils 36 overlapping surface 60. Profiles can be gathered at one or more frequencies using any suitable signal measurement circuitry. As an example, a two-dimensional inductance profile can be obtained using circuitry 76, one or more signal measurement profiles (e.g., two-dimensional profiles) can be gathered using circuit 78 while supplying one or more measurement frequencies with oscillator 84, and one or more signal measurement profiles (e.g., two-dimensional profiles) can be gathered using circuit 94 while oscillator 84 performs one or more frequency sweeps. In general, the frequencies at which oscillator 84 operates when measuring the signal at node N1 with circuitry such as circuit 78 may be 1 kHz to 1 GHz, 0.1 to 50 MHz, at least 10 kHz, at least 100 kHz, at least 500 kHz, less than 100 MHz, less than 10 MHz, less than 1 MHz, less than 100 GHz, etc. Multiple measurements may be made at multiple corresponding frequencies with each of coils 36, so that two-dimensional signal measurement profiles at each of these frequencies can be obtained. These two-dimensional signal measurement profiles (signals at node N1 measured at one or more frequencies of oscillator 84) can used in conjunction with inductance measurement profiles to reveal information about device 10 and other objects on surface 60.

Figure 8:
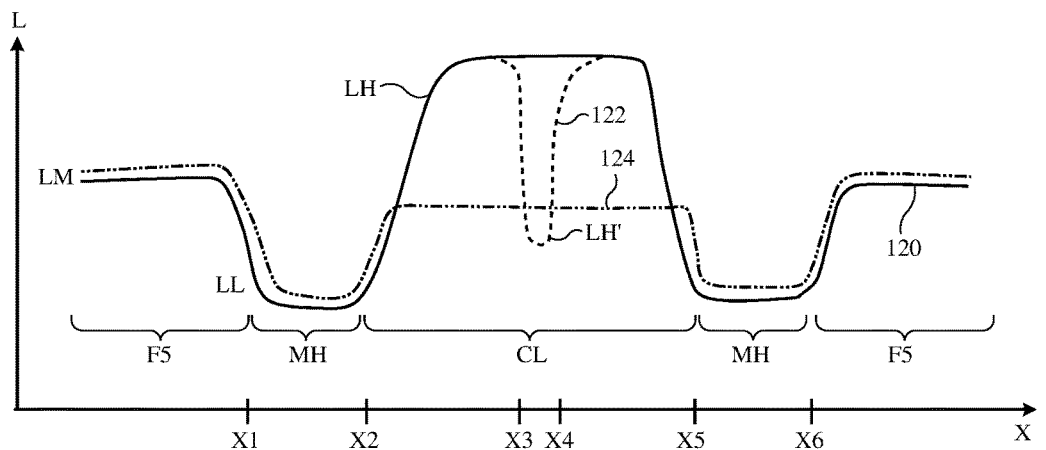
FIG. 8 shows graphs of signal measurements taken using different types of measurement circuitry in a wireless power transmitting device in accordance with an embodiment.
Figure 8:
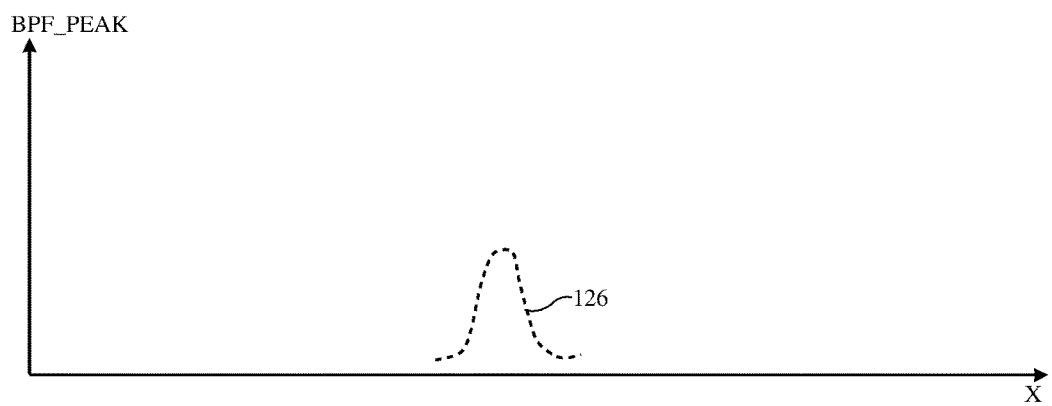
Figure 8:
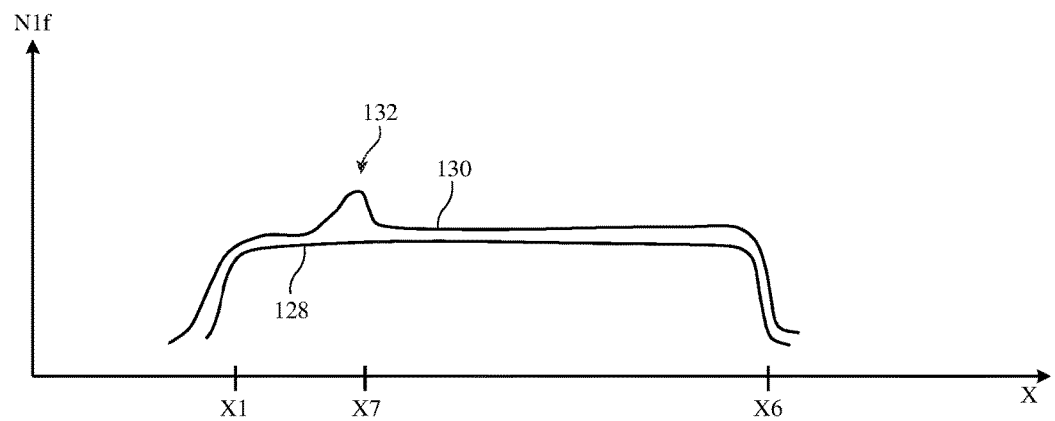

The traces of FIG. 8 show illustrative signal measurement profiles made along one dimension (dimension X in the FIG. 8 example) across surface 60. Two-dimensional signal measurement profiles are made in both X and Y dimensions.

As shown in the upper traces of FIG. 8, inductance measurements can reveal whether a foreign object is present on surface 60, can reveal the location and orientation of device 10 on surface 60, and can reveal additional information such as whether device 10 is right side up (e.g., device 10 is facing upwards and any display on the front face of device 10 is facing upwards such as when device 10 is a cellular telephone or other device with opposing front and rear faces and a display on the front face). Inductance L of the upper traces of FIG. 8 can vary as a function of position X, as indicated by solid curve 120. Curve 120 is a plot of measured inductance L versus distance X across charging surface 60 when an illustrative device 10 is present. The illustrative device 10 that is associated with curve 120 of FIG. 8 has a metal peripheral housing structure (e.g., a metal band that runs around the four sides of a rectangular device such as a cellular telephone, watch, tablet, etc.), a dielectric housing body, and a centrally mounted wireless power receiving coil 14. Away from device 10, in areas FS of transmitting device 12 (e.g., X values less than X1 and more than X6), measured inductance L may have a value LM. When the peripheral metal band of device 10 overlaps coil(s) 36 (e.g., between X1 and X2 for a left portion of the band and between X5 and X6 for a right portion of the band), measured inductance L may drop to lowered value LL. In the center of device 10 (e.g., X between X2 and X5), measured inductance L may be higher due to the presence of coil 14 (see, e.g., inductance LH, which may be larger than inductances LL and LM due to the presence of a ferrite or other magnetic material associated with coil 14).

Recognition of the pattern of curve 120 within the measured inductance profile extending across the surface of coils 36 (e.g., by comparing the pattern associated with curve 120 to a stored pattern in device 12) that was obtained during characterizing measurements) allows control circuitry 42 to determine that device 10 and its coil 14 are present. If a foreign object such as a coin is present under coil 14 of device 10 (in which case charging operations should not be performed), the measured inductance L may drop from LH to a lower value LH' in the middle of coil region CL as indicated by dashed line 122 (e.g., L may decrease when an incompatible object such as a coin is present between X3 and X4). In this situation, application of pattern recognition techniques to the measured profile would not identify any matches between the measured profile and stored valid device patterns that were measured on device 12 in the presence of wireless power receiving device or other authorized wireless power receiving equipment.

Another possible scenario is illustrated by dashed-and-dotted curve 124. Curve 124 corresponds to measurement of an inductance profile for surface 60 when the device of curve 120 has been flipped into an upside down configuration. In this configuration, coil 14, which is on the rear of device 10 in this example, faces upwards and is not adjacent to charging surface 60. As a result, the magnetic material associated with the core of coil 14 is not immediately adjacent to coils 36 and inductance L is not increased in region CL and is lower than value LH. The metal housing walls of device 10, however, continue to lower L in regions MH relative to regions FS. Upside down device inductance patterns and other invalid (not appropriate for charging) patterns can be gathered by characterizing device 12 under a variety of these invalid charging circumstances (e.g., making inductance measurements and/or other signal measurements with the coil array while device 10 is upside down and storing the results in device 12 for use during pattern recognition operations). When control circuitry 42 detects the inductance profiles associated with curve 124, device 12 can issue an alert to the user of system 8 (e.g., an audible or visible alert, an alert issued wirelessly to device 10, etc.) that directs the user to turn device 10 right side up or to otherwise reposition device 10 so that satisfactory charging operations can be performed. The locations of metal walls in regions MH and analysis of the resulting shape, orientation, and location of device 10 on surface 60 that result from gathering the profile in inductance L with circuitry 42 can also be used to select one or more appropriate coils 36 to use in transmitting wireless power to device 10 (e.g., a coil aligned with the center of the metal housing wall which is aligned with coil 14, etc.). Analysis of the shape and size of device 10 can also help identify which type of device is present on charging surface 60 (e.g., so that wireless power levels and other wireless power transmission parameters can be adjusted).

Measurements from swept frequency circuit 94 can be used in characterizing the environment of device 12 in addition to the inductance measurements of the upper traces of FIG. 8. As shown by the middle trace of FIG. 8 (curve 126), the peak output of circuit 94 (peak output BPF_PEAK) can be measured for coils 36 as the output of oscillator 84 is swept in frequency (e.g., from f1 to f2 as described in connection with FIG. 6). In the example of FIG. 6, the value of BPF_PEAK has been plotted as a function of coil position (e.g., X). When an object such as a RFID device is present, there will be a peak in curve 126 at the X position where the foreign object is located as shown in the example of FIG. 8.

The lower traces of FIG. 8 correspond to measurement of the signal at node N1 at two illustrative frequencies for oscillator 84 (e.g., frequencies fa and fb of 1 kHz-1 GHz, at least 10 kHz, at least 100 kHz, at least 1 MHz, at least 100 MHz, at least 10 GHz, less than 100 GHz, or other suitable frequencies). When coins and other foreign objects and/or a device such as device 10 is present on surface 60, the value of output signal N1f on node N1 will vary. In the example of FIG. 8, curve 128 is taken at frequency fa and, due to the presence of device 10, curve 128 rises at coil positions between X1 and X6 (where device 10 is located). At a different frequency (e.g., at frequency fb), the value of signal N1f on node N1 also rises where device 10 overlaps the coils of surface 60 between X1 and X6, as indicated by curve 130, which corresponds to signal N1f when measured at frequency fb. Due to the presence of a structure in device 10 that has a resonance or other unique electrical characteristic when exposed to signals at frequency fb (e.g., circuitry containing one or more electrical components, housing structures, a metal structure in a portion of device 10, etc.), curve 130 in the FIG. 8 example exhibits peak 132 at position X7.

The measurement signal profile patterns of devices such as device 10 can be characterized by making measurements of the type shown in FIG. 8 during manufacturing. Measurements of the type shown in the traces of FIG. 8 may be taken for acceptable wireless power receiving devices in known acceptable charging positions such as face-up orientations on charging surface 60 and for acceptable wireless power receiving devices in known unacceptable positions (e.g., face-down positions for devices with rear-mounted coils). The signal measurement patterns resulting from this characterization information can then be provided to device 12 for use in identifying different devices such as device 10, in determining how device 10 is oriented (e.g., by evaluating the location of asymmetrical signal characteristics such as peak 132 of FIG. 8 and by evaluating the location of positions such as positions X1 and X6 where changes in the measured signal are measured as varying from nominal signal levels when coils 36 are uncovered, by identifying a match between a measured pattern and a pre-stored pattern such as the pattern of curve 124 that corresponds to an upside down device, etc.).

Due to peaks and/or valleys and/or other characteristics in the two-dimensional signal profiles of inductance L (upper traces of FIG. 8), bandpass filter peak BPF_PEAK (middle trace of FIG. 8), and/or output circuit signal N1f measured at two or more frequencies, control circuitry 42 can analyze the position and orientation of device 10 on coils 36, can identify when foreign objects such as coins are present (in the presence of device 10 and in the absence of device 10), can identify which type of device 10 is present (e.g., by determining the shape of device 10 from analysis of the patterns in the two-dimensional signal profiles), can identify whether device 10 is improperly oriented with respect to charging surface 60 (e.g., whether device 10 is right side up or upside down), and can otherwise characterize system 8. This characterization information can then be used to adjust charging parameters and/or take other suitable action.

Figure 9:
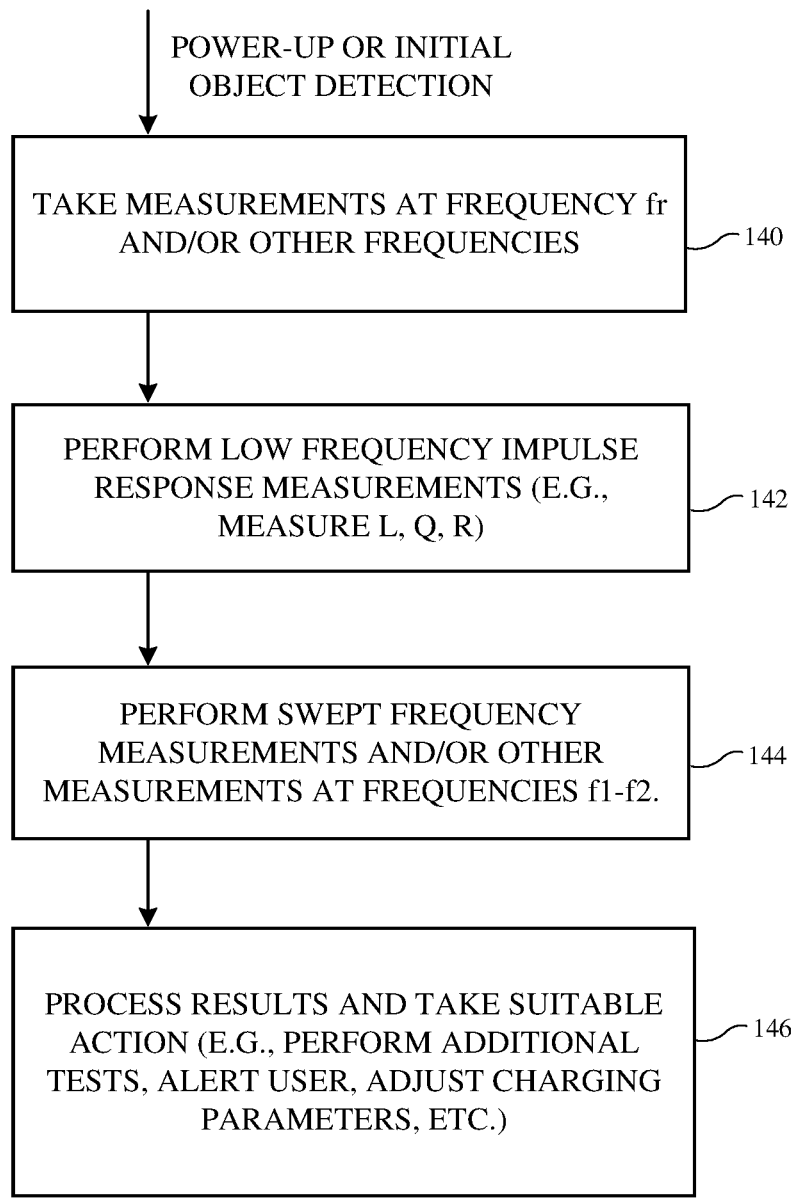
FIG. 9 is a flow chart of illustrative operations involved in operating a wireless power transfer system such as the wireless charging system of FIG. 1 in accordance with an embodiment.

Illustrative operations involved in operating system 8 are shown in FIG. 9. During a low-power standup mode (e.g. following power-up operations and periodically after power-up), control circuitry 42 performs standby measurements. For example, device 12 may use circuitry such as circuit 78 of FIG. 3 to monitor one or more of coils 36 (e.g., each coil 36 in the array of coils 36 in device 12) for the presence of an external object such as one of devices 10 which is potentially compatible for wireless power transfer or an incompatible object such as a coin or badge. A single measurement at frequency fr may be made to determine whether OUT(N1) is lower than expected for any coils 36 or, if desired, multiple measurements at different frequencies near fr may be made (e.g., to determine which direction the coil resonance has shifted due to an external object and thereby help determine whether the object is an electronic device or is a coin or other incompatible foreign object). The standby operations consume a low amount of power (e.g., 50 mW or less, 100 mW or less, more than 1 mW, or other suitable amount). During measurement operations such as standby measurement operations, transistor TP is opened to help decrease the capacitance in parallel with coil 36 and thereby enhance measurement sensitivity.

In response to detection of an external object with control circuitry 42, control circuitry 42 performs additional signal measurement and processing operations.

During the operations of block 140, for example, control circuitry 42 may use circuit 78 and oscillator 84 to make measurements of the signal at node N1 for each coil 36 at one or more measurement frequencies (output signal frequencies from oscillator 84). This allows one or more two-dimensional profiles of signal N1f at the output of circuit 78 to be gathered at one or more respective oscillator frequencies (e.g., two-dimensional signal measurement maps can be gathered as a function of X and Y position across charging surface 60, as described in connection with traces 128 and 130 of FIG. 8).

During the operations of block 142, control circuitry 42 uses inverter 72 or other resonant circuit drive circuitry to apply a stimulus (e.g., a square wave or other signal impulse) to the circuit formed from one or more of coils 36 (e.g., to each coil 36 in the array of coils 36 in device 12, a subset of these coils such as those for which foreign object presence has been detected, and/or other suitable sets of one or more of coils 36), thereby causing that circuit (and that coil 36) to resonate while using a measurement circuit such as impulse response measurement circuitry 76 of FIG. 3 to measure the response of the resonant circuit. As described in connection with FIG. 5, the characteristics of the resulting circuit resonance may then be measured and analyzed. For example, control circuitry 42 may use information on the measured resonant frequency to measure inductance L and may use information on the decay of the signal resonance to determine resistance R and Q factor. As described in connection with the uppermost traces of FIG. 8, by using circuitry 76 to make inductance measurements for each of coils 36 in the array of coils overlapping charging surface 60, control circuitry 42 can make a two-dimensional map of variations in inductance (e.g., a two-dimensional inductance profile in dimensions X and Y of FIG. 2).

Signal measurements with swept-frequency circuitry 94 can be performed during the operations of block 144. In particular, frequency sweep measurements with circuitry such as oscillator circuitry 84 and swept-frequency measurement circuit 94 of FIG. 3 may be performed to check for the presence of a sensitive RFID device, as described in connection with FIG. 6. Impedance injection network 132 helps flatten the frequency response of node N1 during frequency sweep measurements with oscillator 84 and measurement circuit 94. As described in connection with the center traces of FIG. 9, control circuitry 42 can use circuit 94 to measure the peak value of the output of bandpass filter 90 (signal BPF_PEAK) for each coil 36 as the frequency of the oscillator output signal is swept between frequencies of interest, thereby creating a two-dimensional map of these signal measurements (e.g., a two-dimensional profile of BPF_PEAK in dimensions X and Y of FIG. 2).

During the operations of block 146, the two-dimensional signal measurement profiles from blocks 140, 142, and 146 are analyzed by circuitry 42 and suitable actions are taken in response. During manufacturing operations or during other operations prior to device usage by a user, a variety of devices such as device 10 can be characterized by placing these devices on device 12 and capturing numerous two-dimensional signal profiles. For example, a wristwatch device can be placed on charging surface 60 in a normal face up planar orientation (suitable for charging) and can be placed on charging surface 60 in a variety of other orientations (e.g., edge up and rear up configurations that are not generally desirable for charging). As another example, a cellular telephone can be placed on charging surface 60 in face up (suitable for charging) and face down (not generally suitable for charging) orientations while measurements are made. Common foreign objects such as coins can also be characterized.

The device and object characterization information gathered during these characterization operations can include signal measurement profiles with two-dimensional patterns in L, BPF_PEAK, and N1*f*, and/or two-dimensional patterns within two-dimensional measurement profiles associated with other measurement circuit output values (e.g., device-present profiles in X and Y) and can be stored in a database in control circuitry 14. Using pattern recognition techniques during the operations of block 146, device 12 can compare measured signal profile information to predetermined signal profile information to evaluate whether device 10 is present on charging surface 60 in the absence of incompatible objects such as coins and radio-frequency identification devices and is in an appropriate orientation to receive wireless power signals.

In some situations, device 12 can determine that device 10 is present and ready for charging (e.g., a measured profile such as the profile of curve 120 of FIG. 8 may match a known device characteristic (the stored version of the pattern represented by curve 120) indicating that a device is present on charging surface 60 in a face-up configuration and no foreign objects are present). In response to this determination, device 12 can initiate wireless power transfer operations (e.g., using default settings followed by wireless handshaking and wireless power transfer settings optimization).

In other configurations, a foreign object will be detected (e.g., because the measured profiles do not match any patterns that are known from stored signal measurement profiles to be associated with wireless power receiving devices in the absence of foreign objects). In response to detection that an object that is incompatible with wireless charging such as a coin or other foreign object or a sensitive component such as a radio-frequency identification device, etc. is present (e.g., in a scenario in which the objects is interposed between device 10 and device 12), device 12 can issue an alert to the user (e.g., an alert indicating that an incompatible object is present and should be removed before charging can proceed).

Even in the absence of incompatible objects, it may not be appropriate to initiate wireless charging operations in configurations in which device 10 is improperly oriented (e.g., when a watch is edge up or when a cellular telephone or tablet is upside down). Accordingly, device 12 can, during the operations of step 146, alert a user that the orientation of device 12 should be corrected.

In general, alerts can be issued to the user using the resources of device 12 and/or the resources of device 10. As an example, device 12 may issue visible alerts using status-indicator light-emitting diodes, a display, or other component that emits light, may issues audible alerts using a speaker, a tone generator, or other device that emits sound, and may issue haptic alerts using a vibrator or other haptic output device. Device 12 may also present alerts to the user by sending wireless messages to device 10 that direct device 10 to issue a text alert (e.g., "reorient device for charging") or other visible and/or audible and/or haptic alert using the circuitry of device 10.

In some configurations, device 12 may establish a wireless communications link with device 10 (e.g., using wireless communications circuitry with radio-frequency transceivers and antennas in devices 10 and 12 and/or using wireless communications circuitry in which transceivers in devices 10 and 12 are coupled to coils 36 and 14). The wireless link may be used by device 12 to request information on the capabilities of device 10 for wireless power transfer (e.g., device type information, desired power transfer settings, authentication information, etc.). Device 12 can request that device 10 provide this information whenever the presence of a suspected electronic device is detected from measurement of the two-dimensional signal profiles or other signal measurements in device 12 and/or can request this information in situations in which analysis of two-dimensional signal profile information makes it desirable to obtain additional confirmatory information from device 10 before initiating transfer of wireless power from device 12 to device 10 (e.g., in situations in which wireless confirmation of the authorization of device 10 to receive wireless power is desired, in situations in which it is desired to set wireless charging parameters in device 12 based on information on the wireless power transfer capabilities of device 10, battery charge state, and/or other information on device 10, etc.).

In general, the operations performed during block 146 may include pattern recognition operations (e.g., comparing measured signal patterns such as two-dimensional signal measurement profiles) to predetermined two-dimensional signal measurement profiles to determine whether devices 10 and/or incompatible objects are present on charging surface 60 and are properly oriented, may include performing additional tests (e.g., additional signal measurements to gather one or more additional two-dimensional signal measurement profiles at one or more respective additional oscillator frequencies, additional inductance profiles, wireless tests involving wireless interrogation of a suspected device on surface 60 by establishing a wireless link between device 12 and device 10 and sending requests for battery charge status, device type, and other information from device 10, and/or other additional measurements and communications operations), may include issuing alerts (visual, audible, haptic, wireless-based visual, audible, and/or haptic, etc.), may include adjusting wireless power transfer settings (e.g., lowering a maximum permitted wireless power transfer level in device 12 to ensure that device 10 is not supplied with too much power, selecting which coil or coils 36 to use in transferring wireless power signals to device 10, adjusting settings such as wireless power transmission frequency (inverter frequency), duty cycle (inverter duty cycle), and/or otherwise adjusting the charging settings for device 10), and/or may include taking other suitable actions using the circuitry of device 12 and/or one or more devices 10 in system 8.

If desired, pattern recognition operations may be performed using other types of measurements from coils 36. For example, the pattern recognition operations of block 146 can be performed by comparing measured signal patterns such as one-dimensional signal measurement profiles (e.g., measurements from two adjacent coils or from more than two adjacent coils arranged along a single dimension) to predetermined one-dimensional signal measurement profiles to determine whether devices 10 and/or incompatible objects are present on charging surface 60.

The foregoing is illustrative and various modifications can be made to the described embodiments. The foregoing embodiments may be implemented individually or in any combination.

What is claimed is:

1. A wireless power transmitting device with a charging surface configured to receive a wireless power receiving device that has a wireless power receiving coil, the wireless power transmitting device comprising:
   an array of coils;
   output circuitry coupled to the array of coils and configured to transmit wireless power signals to the wireless power receiving device with at least a selected one of the coils;
   oscillator circuitry that supplies the output circuitry with an oscillator output signal;
   at least one measurement circuitry coupled to the output circuitry; and
   control circuitry configured to:
      gather at least first and second different two-dimensional signal measurement profiles with a plurality of coils including at least the selected one of the coils in the array of coils using signals from the measurement circuitry obtained as the oscillator output signal is supplied to the output circuitry at respective first and second different frequencies, wherein the two-dimensional signal measurement profiles comprise measurements gathered as a function of coil location across the charging surface of the wireless power transmitting device; and
      cause an action in response to comparison of the first and second two-dimensional signal measurement profiles to predetermined two-dimensional signal measurement profile information.

2. The wireless power transmitting device defined in claim 1, wherein the measurement circuitry comprises a peak detector and an analog-to-digital converter coupled to the peak detector.

3. The wireless power transmitting device defined in claim 2 wherein the control circuitry is configured to control transmission of wireless power to the wireless power receiving device with the output circuitry based at least partly on the comparison of the first and second two-dimensional signal measurement profiles to the predetermined two-dimensional signal measurement profile information.

4. The wireless power transmitting device defined in claim 3 wherein the predetermined two-dimensional signal measurement profile information comprises two-dimensional information on at least one pattern of signal measurements on the array of coils gathered in the presence of a device with a wireless power receiving coil when no objects incompatible with wireless power transfer operations are present on the array of coils.

5. The wireless power transmitting device defined in claim 4 further comprising impulse response measurement circuitry coupled to the output circuitry.

6. The wireless power transmitting device defined in claim 5 wherein the control circuitry is further configured to gather inductance measurements from the array of coils using the impulse response measurement circuitry.

7. The wireless power transmitting device defined in claim 6 wherein the control circuitry is further configured to generate a two-dimensional inductance profile for the charging surface based on the inductance measurements.

8. The wireless power transmitting device defined in claim 7 wherein the control circuitry is further configured to compare the two-dimensional inductance profile to predetermined inductance profile information associated with inductance patterns for predetermined electronic devices oriented for wireless charging on the charging surface.

9. The wireless power transmitting device defined in claim 8 wherein the control circuitry is configured to take the action at least partly in response to comparing the two-dimensional inductance profile to the predetermined inductance profile information.

10. The wireless power transmitting device defined in claim 9 wherein the action comprises an action selected from the group consisting of: issuing an alert, adjusting wireless power transmission settings for the wireless power transmitting circuitry, transmitting wireless communications signals.

11. The wireless power transmitting device defined in claim 9 wherein the action comprises issuing an alert, wherein the wireless power transmitting device includes an output component, and wherein the control circuitry is further configured to present the alert with the output component.

12. The wireless power transmitting device defined in claim 9 wherein the action comprises issuing an alert and wherein the control circuitry is configured to wirelessly transmit information on the alert to the wireless power receiving device.

13. The wireless power transmitting device defined in claim 9 wherein the action comprises selecting a coil in the array of coils and wherein the control circuitry is configured to select the coil and is configured to use the output circuitry to transmit the wireless power signals to the wireless power receiving device with the selected coil.

14. The wireless power transmitting device defined in claim 1 wherein the measurement circuitry comprises coil inductance measurement circuitry coupled to the array of coils that produces coil inductance measurements, wherein the action comprises generating an alert, and wherein the control circuitry is further configured to determine whether to generate the alert based on analysis of the coil inductance measurements and comparison of at least the first and second two-dimensional signal measurement profiles to the predetermined two-dimensional signal measurement profile information, wherein the first two-dimensional signal measurement profile corresponds to signals from the measurement circuitry obtained when the oscillator signal has a first frequency, and wherein the second two-dimensional signal measurement profile corresponds to signals from the measurement circuitry obtained when the oscillator signal has a second frequency that is different from the first frequency.

15. A wireless power transmitting device with a charging surface configured to receive a wireless power receiving device that has a wireless power receiving coil, the wireless power transmitting device comprising:
an array of coils;
output circuitry coupled to the array of coils and configured to transmit wireless power signals to the wireless power receiving device with at least a selected one of the coils;
oscillator circuitry that supplies the output circuitry with an oscillator output signal;
signal measurement circuitry coupled to the output circuitry that is configured to make measurements on the output circuitry while the oscillator circuitry supplies the output circuitry with the oscillator output signal;
impulse response measurement circuitry coupled to the output circuitry; and
control circuitry configured to:
gather a two-dimensional signal measurement profile with the array of coils using signals from the signal measurement circuitry obtained as the oscillator output signal is supplied to the output circuitry, wherein the two-dimensional signal measurement profile comprises measurements gathered using a plurality of coils in the array of coils across the charging surface of the wireless power transmitting device;
gather a two-dimensional coil inductance profile with the impulse response measurement circuitry; and
analyze at least the two-dimensional coil inductance profile and the two-dimensional signal measurement profile to determine an action to take in response to comparing the two-dimensional inductance profile and the two-dimensional signal measurement profile to predetermined two-dimensional profiles of inductance and measured signals obtained from a coil array in the presence of wireless power receiving equipment overlapping the coil array.

16. The wireless power transmitting device defined in claim 15 wherein the action to take comprises an action selected from the group consisting of: issuing an alert, adjusting a wireless power transmission setting associated with transmitting the wireless power signals, initiating wireless communications with the wireless power receiving device, and gathering additional signal measurements from the output circuitry.

17. The wireless power transmitting device defined in claim 15 wherein the action comprises issuing an alert indicating that the wireless power receiving device is upside down on the charging surface.

18. The wireless power transmitting device defined in claim 15 wherein the signal measurement circuitry comprises
a first peak detector coupled to a node in the output circuitry; and
a second peak detector coupled to the node in the output circuitry.

19. A wireless power transmitting device with a charging surface configured to receive a wireless power receiving device that has a wireless power receiving coil, the wireless power transmitting device comprising:
an array of power transmitting coils;
output circuitry coupled to the array of power transmitting coils and configured to transmit wireless power signals to the wireless power receiving device with at least a selected one of the power transmitting coils;
oscillator circuitry that supplies the output circuitry with an oscillator output signal;
signal measurement circuitry coupled to the output circuitry that is configured to make measurements on the output circuitry while the oscillator circuitry supplies the output circuitry with the oscillator output signal;
impulse response measurement circuitry coupled to the output circuitry; and
control circuitry configured to:
gather first signal measurements from the signal measurement circuitry for at least some of the power transmitting coils in the array when the oscillator output signal has a first frequency;
gather second signal measurements from the signal measurement circuitry for at least some of the power transmitting coils in the array when the oscillator output signal has a second frequency;
gather coil inductance measurements for at least some of the power transmitting coils in the array with the impulse response measurement circuitry; and
analyze patterns in the first signal measurements, second signal measurements, and coil inductance measurements to determine whether to take an action selected from the group consisting of: initiating wireless communications with the wireless power receiving device, issuing an alert, and transmitting the wireless power signals.

20. The wireless power transmitting device defined in claim 19, wherein the signal measurement circuitry comprises at least one peak detector, wherein the control circuitry is configured to analyze the patterns by generating two-dimensional profiles of the first signal measurements, second signal measurements, and coil inductance measurements, and wherein the two-dimensional profiles comprise measurements gathered using different coils in the array of power transmitting coils across the charging surface.

21. The wireless power transmitting device defined in claim 19, wherein each coil in the array of power transmitting coils is coupled in series with a respective switch, wherein the first and second signal measurements are gathered while the switches associated with the at least some of the power transmitting coils are turned off, and wherein the coil inductance measurements are gathered while the switches associated with the at least some of the power transmitting coils are turned on.

* * * * *